(12) United States Patent
Cho et al.

(10) Patent No.: US 10,644,050 B2
(45) Date of Patent: May 5, 2020

(54) IMAGE SENSOR HAVING MICRO LENSES ARRANGED IN DIFFERENT PERIODS

(71) Applicant: SK hynix Inc., Gyeonggi-do (KR)

(72) Inventors: Sung-Wook Cho, Gyeonggi-do (KR); Min-Su Cho, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/220,141

(22) Filed: Dec. 14, 2018

(65) Prior Publication Data

US 2019/0259796 A1 Aug. 22, 2019

(30) Foreign Application Priority Data

Feb. 19, 2018 (KR) .................. 10-2018-0019210

(51) Int. Cl.
*H01L 27/14* (2006.01)
*H01L 31/00* (2006.01)
*H01L 27/146* (2006.01)
*H04N 5/374* (2011.01)

(52) U.S. Cl.
CPC .. *H01L 27/14627* (2013.01); *H01L 27/14603* (2013.01); *H01L 27/14605* (2013.01); *H01L 27/14607* (2013.01); *H01L 27/14621* (2013.01); *H01L 27/14623* (2013.01); *H01L 27/14645* (2013.01); *H01L 27/14685* (2013.01); *H04N 5/374* (2013.01)

(58) Field of Classification Search
CPC ......... H01L 27/14627; H01L 27/14603; H01L 27/14605; H01L 27/14607; H01L 27/14623
USPC ........................................... 257/432
See application file for complete search history.

(56) References Cited

U.S. PATENT DOCUMENTS

| 6,638,786 | B2 | 10/2003 | Yamamoto |
| 7,282,686 | B2 | 10/2007 | Ahn |
| 7,608,875 | B2 | 10/2009 | Yang et al. |
| 2006/0043260 | A1* | 3/2006 | Ma .................... H01L 27/14618 250/208.1 |

* cited by examiner

*Primary Examiner* — David S Blum
(74) *Attorney, Agent, or Firm* — Perkins Coie LLP

(57) ABSTRACT

An image sensor including a pixel area and a peripheral area surrounding the pixel area is described. The pixel area may include first micro lenses. The peripheral area may include second micro lenses. The first micro lenses may be arranged with a first period. The second micro lenses may be arranged with a second period different from the first period.

24 Claims, 18 Drawing Sheets

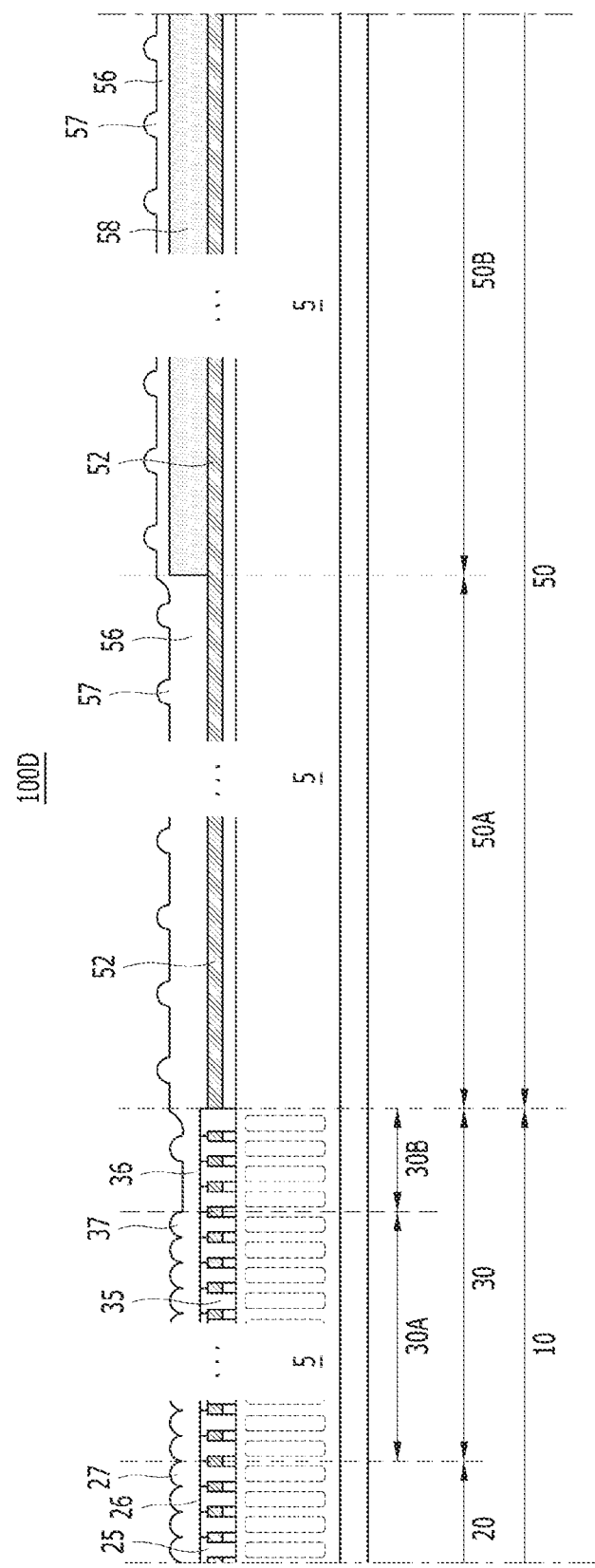

IMAGE SENSOR HAVING MICRO LENSES ARRANGED IN DIFFERENT PERIODS

CROSS-REFERENCE TO RELATED APPLICATION

This patent document claims the priority and benefits under 35 U.S.C. § 119 to Korean Patent Application No. 10-2018-0019210 filed on Feb. 19, 2018, which is incorporated herein by reference in its entirety.

TECHNICAL FIELD

The technology and implementations disclosed in this patent document relate to an image sensor and a camera system including the image sensor.

BACKGROUND

Recently, with the development of the information communication industry and the digitalization of electronic devices, image sensors with improved performance have been used in various fields such as a digital camera, a camcorder, a mobile phone, a PCS (personal communication system), a game machine, security camera and a medical micro camera.

SUMMARY

This patent document provides, among others, designs of an image sensor in which a flare phenomenon is prevented.

Also, various embodiments are directed to an image sensor including micro lenses which are arranged in different periods in a pixel area and a peripheral area, respectively.

Further, various embodiments are directed to a camera system including an image sensor.

In an embodiment, an image sensor may include: a pixel area; and a peripheral area surrounding the pixel area. The pixel area may include first micro lenses. The peripheral area may include second micro lenses. The first micro lenses may be arranged with a first period. The second micro lenses may be arranged with a second period different from the first period.

In an embodiment, an image sensor may include: a first pixel area; and a peripheral area surrounding the first pixel area. The first pixel area may include first pixel grid patterns disposed over a substrate; first pixel color filters formed in spaces between the first pixel grid patterns; a first pixel overcoating layer over the first pixel color filters; and first pixel micro lenses disposed over the first pixel overcoating layer. The peripheral area may include a shield layer disposed over the substrate; a peripheral overcoating layer disposed over the shield layer; and peripheral micro lenses disposed over the peripheral overcoating layer. The first pixel micro lenses may be arranged with a first period. The peripheral micro lenses may be arranged with a second period different from the first period.

In an embodiment, an image sensor includes a pixel area structured to include photosensing pixels that detect light of a scene to produce pixel signals representing the detected scene including spatial information of the detected scene; and a peripheral area structured to surround the pixel area and to shield light. The pixel area includes first micro lenses positioned over the photosensing pixels in a periodic array with a first spatial period, and the peripheral area includes second micro lenses in a periodic array with a second, different spatial period.

In an embodiment, an image sensor includes a first pixel area structured to include first pixels each operable to sense light and to produce a pixel signal representing sensed light; and a peripheral area surrounding the first pixel area. The first pixel area includes first pixel grid patterns that are disposed over a substrate and are formed by the first pixels; first pixel color filters formed in spaces between the first pixel grid patterns; a first pixel overcoating layer over the first pixel color filters; and first pixel micro lenses disposed over the first pixel overcoating layer. The peripheral area includes a shield layer disposed over the substrate; a peripheral overcoating layer disposed over the shield layer; and peripheral micro lenses disposed over the peripheral overcoating layer. The first pixel micro lenses are arranged in a first periodic pattern with a first spatial period. The peripheral micro lenses are arranged in a second periodic pattern with a second spatial period different from the first spatial period.

In an embodiment, an image sensor includes an inner pixel area which detects light of a scene to produce pixel signals representing the detected scene including spatial information of the detected scene and including first micro lenses arranged with a first period; an outer pixel area located to surround the inner pixel area and including second micro lenses arranged with a second period; and a peripheral area located to surround the outer pixel area and including third micro lenses arranged with a third period. Two of the first period, the second period, and the third period are different from each other.

The details of other embodiments are included in the detailed description and the drawings.

Since the image sensors according to the embodiments include pixel micro lenses which are arranged in a first period and peripheral micro lenses which are arranged in a second period, it is possible to prevent a flare phenomenon by using reflected diffraction light in a peripheral area.

Other advantages according to various embodiments of the disclosed technology have been described in the text.

BRIEF DESCRIPTION OF THE DRAWINGS

FIGS. 7A and 7B are schematic longitudinal sectional views illustrating representations of examples of image sensors in accordance with embodiments.

DETAILED DESCRIPTION

Figure 1:
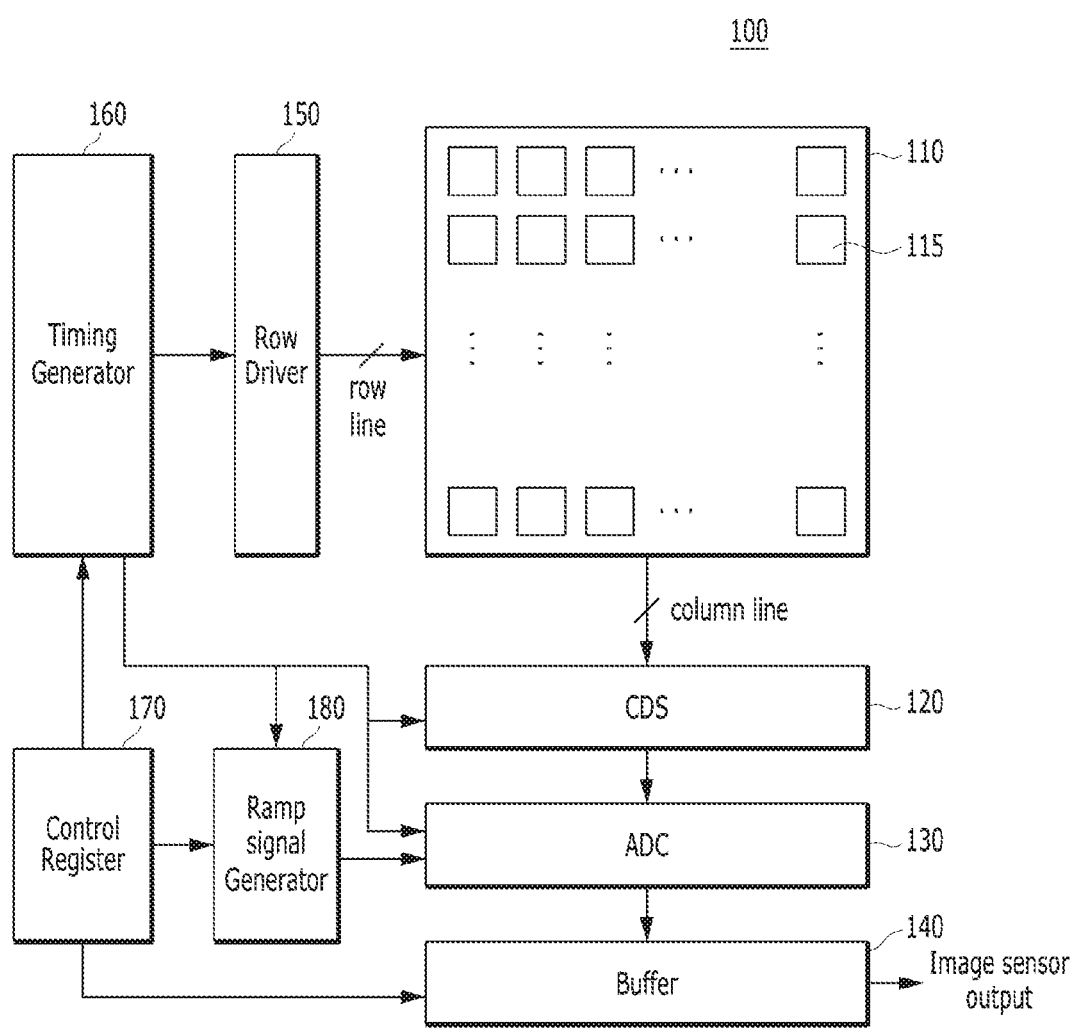
FIG. 1 is a block diagram schematically illustrating a representation of an example of an image sensor in accordance with an embodiment.

The disclosed technology can be implemented to provide an image sensor which can reduce or prevent undesired light scattering or flaring. Implementations of the disclosed technology provide various designs for an optical region including a pixel area and a peripheral area.

In the disclosed technology, advantages, features and methods for achieving them will become more apparent after a reading of the following exemplary embodiments taken in conjunction with the drawings. The disclosed technology may, however, be embodied in different forms and should not be construed as limited to the embodiments set forth herein. Throughout the disclosure, like reference numerals refer to like parts throughout the various figures and embodiments of the present invention.

Terms used in this specification are used for describing various embodiments, and do not limit the disclosed technology. As used herein, a singular form is intended to include plural forms as well, unless the context clearly indicates otherwise. It will be further understood that the terms "include" and/or "including," when used in this specification, specify the presence of at least one stated feature, step, operation, and/or element, but do not preclude the presence or addition of one or more other features, steps, operations, and/or elements thereof.

Throughout the specification, like reference numerals refer to like elements. Therefore, although the same or similar reference numerals are not mentioned or described in a corresponding drawing, the reference numerals may be described with reference to other drawings. Furthermore, although elements are not represented by reference numerals, the elements may be described with reference to other drawings.

FIG. 1 is a block diagram schematically illustrating a representation of an example of an image sensor 100 in accordance with an embodiment. Referring to FIG. 1, the image sensor 100 in accordance with the embodiment may include a pixel array 110, a correlated double sampler (CDS) 120, an analog-digital converter (ADC) 130, a buffer 140, a row driver 150, a timing generator 160, a control register 170, and a ramp signal generator 180. The pixel array 110 may include a plurality of pixel blocks 115 which are arranged in a matrix structure, e.g., an array of pixels arranged in columns and rows. Each pixel block 115 is structured to sense incident light, convert optical image information carried by the incident light into an electrical image signal, and transmits or transfers the electrical image signal to the CDS 120 through a column line. Each of the pixel blocks 115 may be coupled with one of row lines and one of column lines. The CDS 120 may sample or process the electrical image signals which are received from the pixel blocks 115 in the pixel array 110. For example, the CDS 120 may perform sampling of a reference voltage level and the voltage level of a received electrical image signal according to a clock signal provided from the timing generator 160, and transmit an analog signal corresponding to the difference therebetween to the ADC 130. The ADC 130 may convert the received analog signal into a digital signal, and transmit the digital signal to the buffer 140. The buffer 140 may latch or hold the received digital signal and successively output the latched digital signal to an external image signal processor. The buffer 140 may include a memory for latching or holding a digital signal and a sense amplifier for amplifying the digital signal. The row driver 150 may drive the pixel blocks 115 of the pixel array 110 according to a signal of the timing generator 160. For example, the row driver 150 may generate select signals for selecting one of the row lines and/or driving signals for driving one of the row lines. The timing generator 160 may generate a timing signal for controlling the CDS 120, the ADC 130, the row driver 150 and the ramp signal generator 180. The control register 170 may generate control signals for controlling the buffer 140, the timing generator 160 and the ramp signal generator 180. The ramp signal generator 180 may generate a ramp signal for controlling an image signal outputted from the ADC 130 to the buffer 140, according to control of the timing generator 160.

Figure 2:
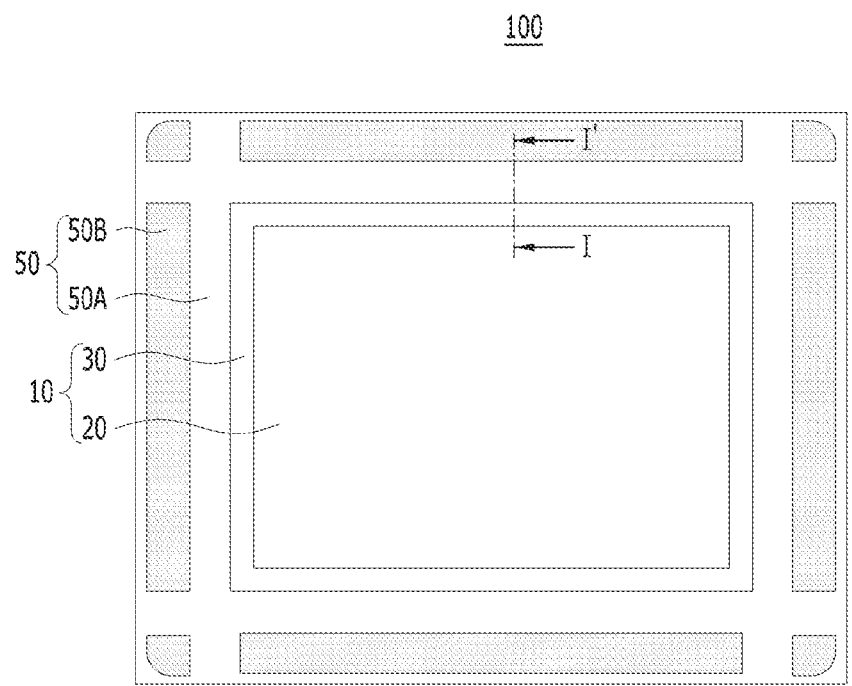
FIG. 2 is a schematic block layout diagram illustrating a representation of an example of the image sensor in accordance with the embodiment.

FIG. 2 is a block layout diagram schematically illustrating a representation of an example of the image sensor 100 in accordance with one embodiment of the disclosed technology. Referring to FIG. 2, the image sensor 100 in accordance with the embodiment may include a pixel area 10 and a peripheral area 50. The pixel area 10 may include an inner pixel area 20 and an outer pixel area 30 surrounding the inner pixel area 20. The inner pixel area 20 may be disposed in the form of a quadrangle at the center of the image sensor 100. The outer pixel area 30 may be disposed in the form of a quadrangular frame which surrounds the inner pixel area 20. The inner pixel area 20 may operate as a pixel area for sensing and converting light into pixel signals. The outer pixel area 30 and the peripheral area 50 may not operate as a pixel area for sensing and converting light into pixel signals.

The peripheral area 50 may include a peripheral pixel shield area 50A and peripheral logic shield areas 50B. The peripheral pixel shield area 50A may be disposed in the form of a quadrangular frame which surrounds the periphery of the pixel area 10. The peripheral logic shield areas 50B may be arranged to be separated from the pixel area 10 and, in some implementations, are spatially distributed to surround, or be on the outer peripheral areas of, the pixel area 10 and the peripheral pixel shield area 50A. The peripheral logic shield areas 50A may be located on different portions of the pixel area 10 and the peripheral logic shield areas 50B may be located on different portions of the peripheral pixel shield area 50A. For example, the peripheral logic shield areas 50B may be disposed in/on the peripheral pixel shield area 50A. The peripheral logic shield areas 50B may be disposed in the form of bars or islands which are adjacent to the sides and/or corners of the peripheral pixel shield area 50A. The horizontal or vertical lengths of the peripheral logic shield areas 50B may be smaller than the horizontal width or vertical width of the outer pixel area 30.

The peripheral logic shield areas 50B may be disposed in various manners. The peripheral logic shield areas 50B can be disposed on selective portions of the peripheral pixel shield area 50A. For example, the peripheral logic shield areas 50B may be disposed at one or more of the four sides of the peripheral pixel shield area 50A or at two or more of the four corners of the peripheral pixel shield area 50A.

Figure 3:
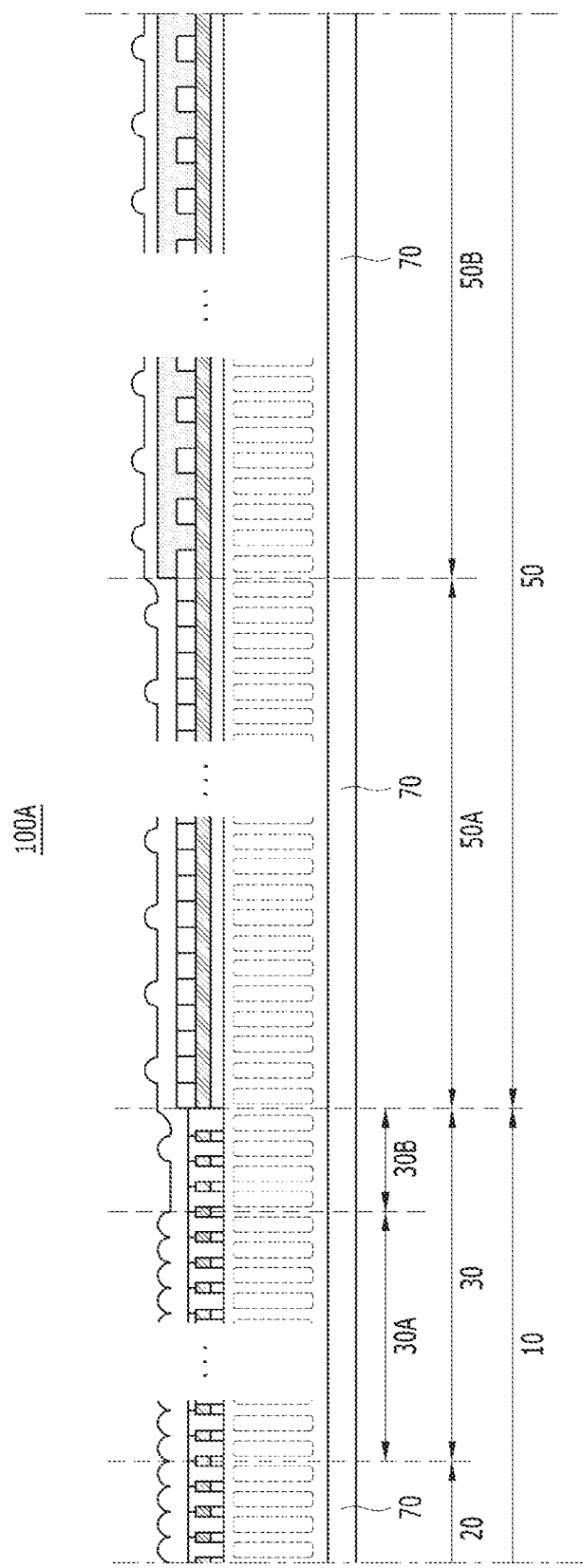
FIG. 3 is a schematic longitudinal sectional view taken along the line I-I' of the image sensor in accordance with the embodiment shown in FIG. 2.

FIG. 3 is a schematic longitudinal sectional view taken along the line I-I' of the image sensor 100 in accordance with the embodiment shown in FIG. 2. Briefly, an image sensor 100A may include a pixel area 10 which has an inner pixel area 20 and an outer pixel area 30 and a peripheral area 50 which has a peripheral pixel shield area 50A and peripheral logic shield areas 50B.

FIGS. 4A to 4D are enlarged views schematically illustrating the inner pixel area 20, the outer pixel area 30, the peripheral pixel shield area 50A and the peripheral logic shield area 50B of the image sensor 100A of FIG. 3.

Figure 4A:
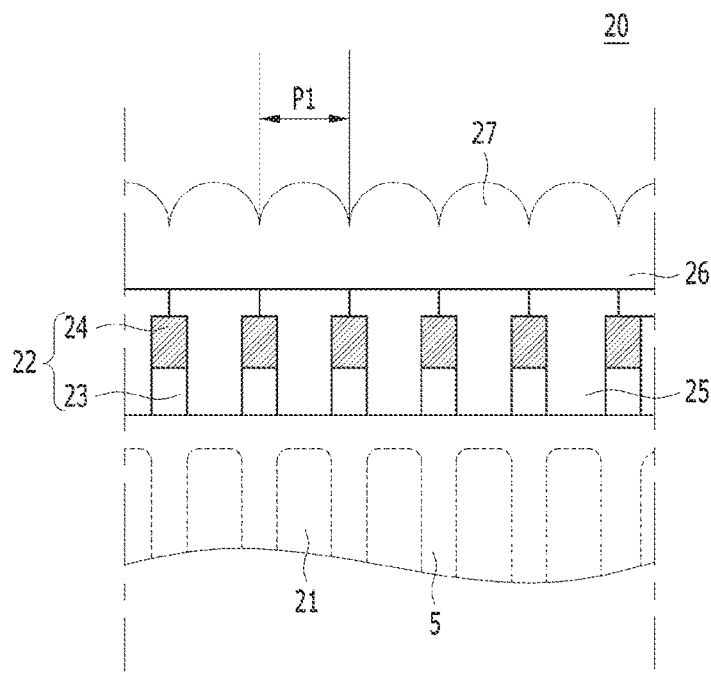
FIGS. 4A to 4D are enlarged views schematically illustrating the inner pixel area, the outer pixel area, the peripheral pixel shield area and the peripheral logic shield area of the image sensor of FIG. 3.

Referring to FIGS. 3 and 4A, the inner pixel area 20 of the image sensor 100A in accordance with an embodiment may include inner pixel photodiodes 21 which are formed in a substrate 5, and inner pixel grid patterns 22, inner pixel color filters 25, an inner pixel overcoating layer 26 and inner pixel micro lenses 27 which are formed on the top surface of the substrate 5.

Figure 4B:
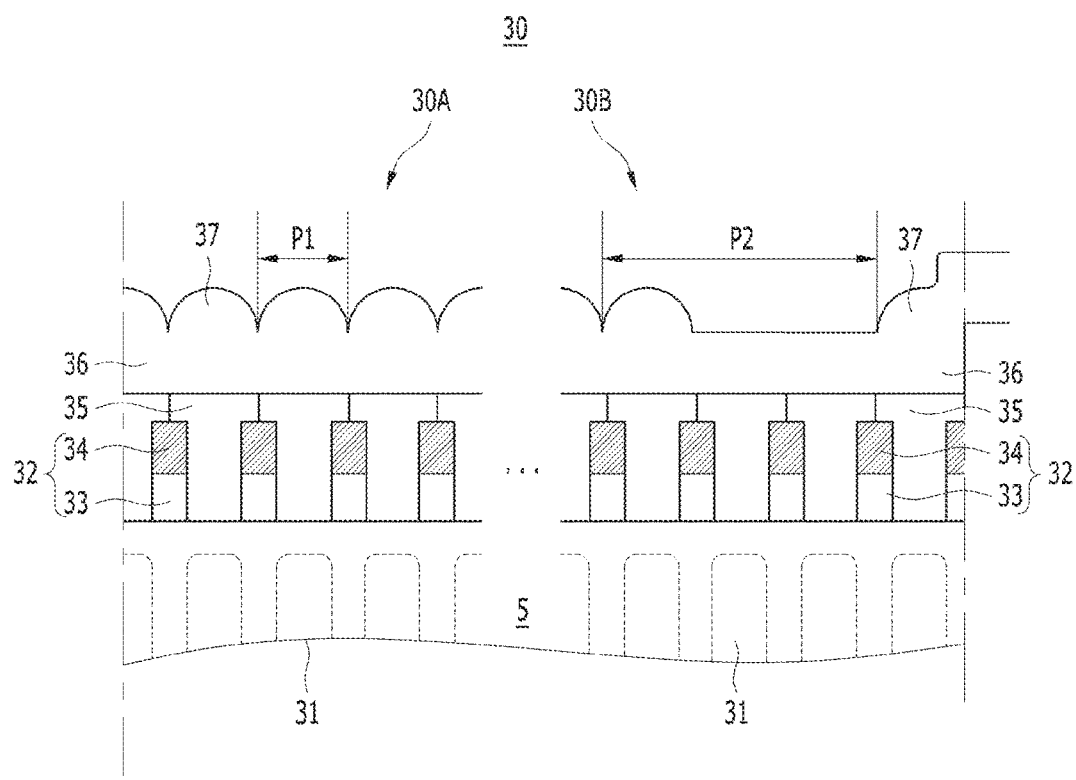

Referring to FIGS. 3 and 4B, the outer pixel area 30 of the image sensor 100A in accordance with the embodiment may include outer pixel photodiodes 31 which are formed in the substrate 5, and outer pixel grid patterns 32, outer pixel color filters 35, an outer pixel overcoating layer 36 and outer pixel micro lenses 37 which are formed on the top surface of the substrate 5.

Figure 4C:
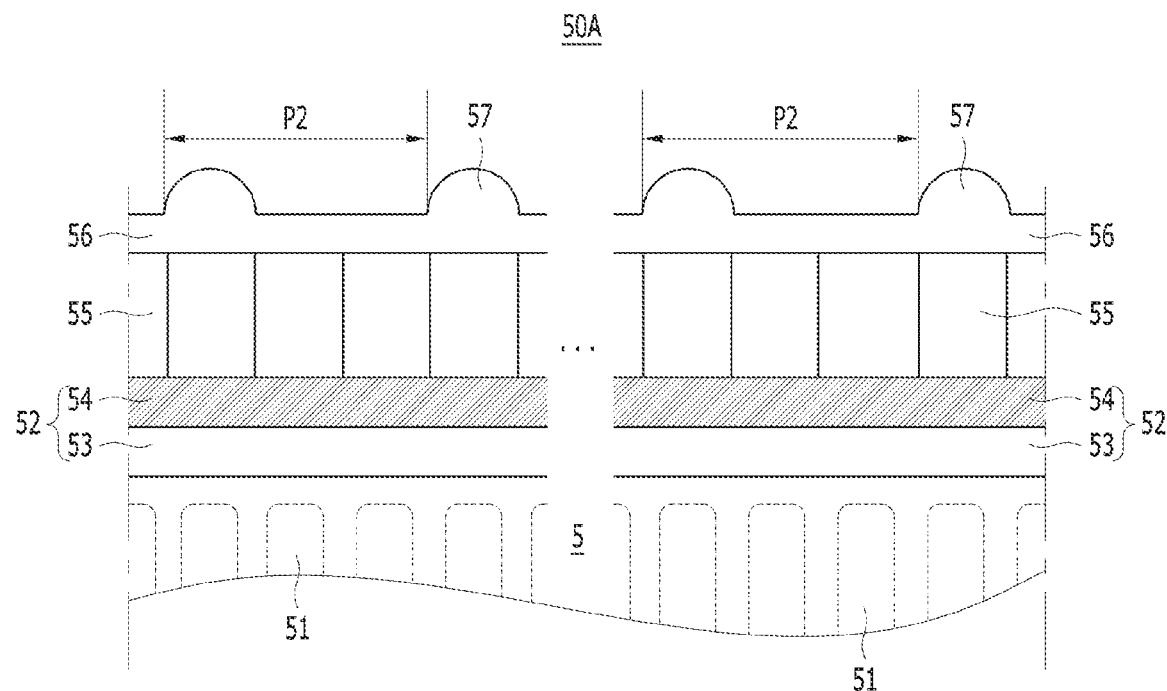
Figure 4D:
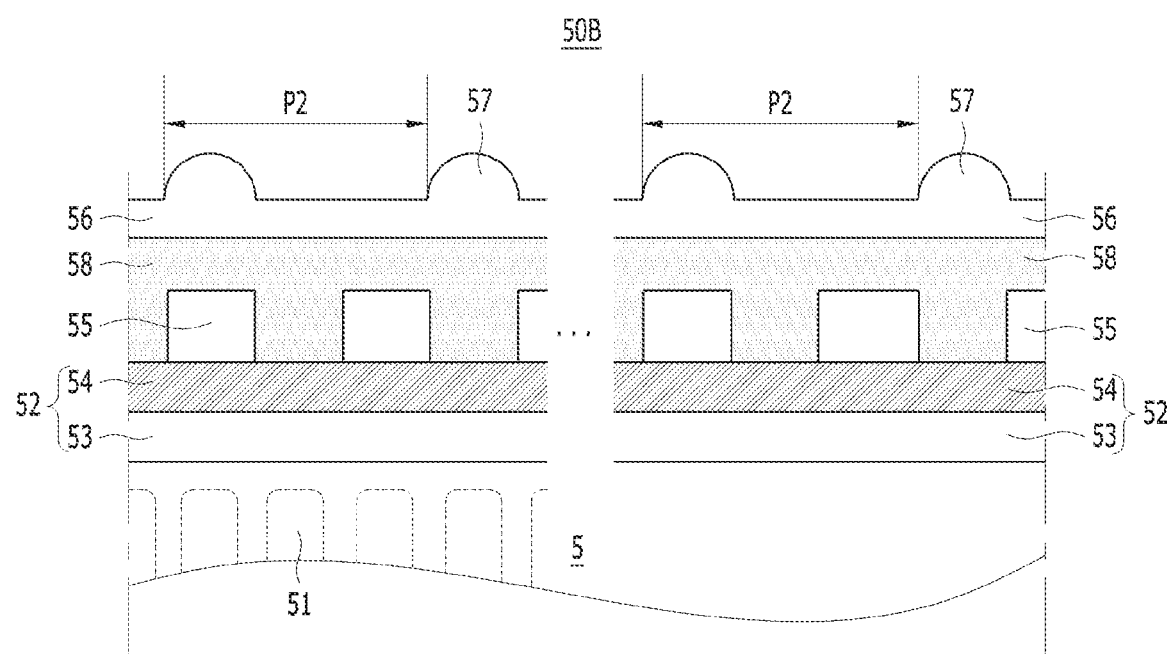

Referring to FIGS. 3, 4C and 4D, the peripheral pixel shield area 50A of the image sensor 100A in accordance with the embodiment may include peripheral photodiodes 51 which are formed in the substrate 5, and a shield layer 52, peripheral color filters 55, a peripheral overcoating layer 56 and peripheral micro lenses 57 which are formed on the top surface of the substrate 5. The peripheral logic shield area 50B may include a shield layer 52, peripheral color filters 55, a peripheral overcoating layer 56 and peripheral micro lenses 57 which are formed on the top surface of the substrate 5. As compared to the peripheral pixel shield area 50A, the peripheral logic shield area 50B may further include an over color filter 58 which covers the peripheral color filters 55. In addition, the peripheral logic shield area 50B may have a portion in which the peripheral photodiodes 51 of the peripheral pixel shield area 50A are not included. Accordingly, the peripheral photodiodes 51 may be formed in only a portion of the peripheral pixel shield area 50A, and may not be formed in some area of the peripheral logic shield area 50B.

The substrate 5 may include a single crystal silicon layer or an epitaxially grown silicon layer. A dielectric layer 70 which includes various transistors (not shown) and metal lines (not shown) may be formed on the bottom surface of the substrate 5. The dielectric layer 70 may include a dielectric material such as a silicon oxide or a silicon nitride.

The inner pixel photodiodes 21, the outer pixel photodiodes 31 and the peripheral photodiodes 51 may include areas which are doped with an N-type ion such as phosphorous (P) and arsenic (As). In another embodiment, the inner pixel photodiodes 21, the outer pixel photodiodes 31 and the peripheral photodiodes 51 may include areas which are doped with a P-type ion such as boron (B).

Each of the inner pixel grid patterns 22 and the outer pixel grid patterns 32 may have a lattice-like mesh shape when viewed on the top. In some implementations, each of the inner pixel grid patterns 22 and the outer pixel grid patterns 32 may include bottom inner pixel grid patterns 23 or 33 and top inner pixel grid patterns 24 or 34.

The shield layer 52 may have a flat board shape or a plate shape. The shield layer 52 may include a bottom shield layer 53 and a top shield layer 54. The bottom inner pixel grid patterns 23, the bottom outer pixel grid patterns 33 and the bottom shield layer 53 may include a dielectric material such as a silicon oxide, a silicon oxynitride and a silicon nitride. The top inner pixel grid patterns 24, the top outer pixel grid patterns 34 and the top shield layer 54 may include a metal such as tungsten (W).

The inner pixel color filters 25 may be filled in the spaces between the inner pixel grid patterns 22. The outer pixel color filters 35 may be filled in the spaces between the outer pixel grid patterns 32. The peripheral color filters 55 and the over color filter 58 may be formed on the shield layer 52. Because the peripheral color filters 55 are formed on the shield layer 52, they may be positioned at a level higher than the inner pixel color filters 25 and the outer pixel color filters 35. The inner pixel color filters 25, the outer pixel color filters 35 and the peripheral color filters 55 may include red color filters, green color filters and blue color filters. In the peripheral logic shield area 50B, the peripheral color filters 55 may include red color filters and green color filters, and the over color filter 58 may include a blue color filter. The inner pixel color filters 25, the outer pixel color filters 35 and the peripheral color filters 55 which are designed to produce the same color by the filter operation may have substantially the same or similar vertical thicknesses. The inner pixel color filters 25, the outer pixel color filters 35 and the peripheral color filters 55 which have different colors may have different vertical thicknesses. The over color filter 58 may have a vertical thickness greater than the peripheral color filters 55. Therefore, the over color filter 58 may cover the peripheral color filters 55 in the peripheral logic shield area 50B.

The inner pixel overcoating layer 26, the outer pixel overcoating layer 36 and the peripheral overcoating layer 56 may be formed entirely on the inner pixel color filters 25, the outer pixel color filters 35, the peripheral color filters 55 and the over color filter 58. The inner pixel overcoating layer 26, the outer pixel overcoating layer 36 and the peripheral overcoating layer 56 may have planar top surfaces, respectively. Since the over color filter 58 in the peripheral logic shield area 50B is thicker than the peripheral color filters 55, the peripheral overcoating layer 56 in the peripheral logic shield area 50B may be formed at a level higher than the peripheral overcoating layer 56 in the peripheral pixel shield area 50A. The inner pixel overcoating layer 26, the outer pixel overcoating layer 36 and the peripheral overcoating layer 56 may include a polymeric material.

The inner pixel micro lenses 27, the outer pixel micro lenses 37 and the peripheral micro lenses 57 may be formed on the inner pixel overcoating layer 26, the outer pixel overcoating layer 36 and the peripheral overcoating layer 56, respectively. The inner pixel micro lenses 27, the outer pixel micro lenses 37 and the peripheral micro lenses 57 may include the same material as the inner pixel overcoating layer 26, the outer pixel overcoating layer 36 and the peripheral overcoating layer 56, respectively.

Referring to FIG. 4A, in the inner pixel area 20, the inner pixel micro lenses 27 may be repeatedly arranged side by side with a first period P1. For example, the horizontal width (for example, the diameter) of the inner pixel micro lenses 27 may be substantially the same as the first period P1. In other words, in the inner pixel area 20, the inner pixel micro lenses 27 may be repeatedly arranged side by side with a first pitch P1.

Referring to FIG. 4B, in the outer pixel area 30, the outer pixel micro lenses 37 may be arranged differently in a first outer pixel area 30A and a second outer pixel area 30B. The outer pixel micro lenses 37 may be repeatedly arranged side by side with the first period P1 (or the first pitch P1). For example, in the first outer pixel area 30A of the outer pixel area 30 which is close to the inner pixel area 20, the outer pixel micro lenses 37 may be arranged with the first period P1 (or the first pitch P1) in the same manner as the inner pixel micro lenses 27. In addition, in the second outer pixel area 30B of the outer pixel area 30 which is close to the peripheral area 50, the outer pixel micro lenses 37 may be repeatedly arranged with a second period P2 (or a second pitch P2) different from the first period P1. For instance, the second period P2 may be three times the first period P1. In this case, if the first period P1 (or the first pitch P1) is 1 μm, the second period P2 (or the second pitch P2) may be 3 μm.

Referring to FIGS. 4C and 4D, in the peripheral pixel shield area 50A and the peripheral logic shield area 50B, the peripheral micro lenses 57 may be repeatedly arranged with the second period P2 (or the second pitch P2). Thus, the inner pixel micro lenses 27 and the outer pixel micro lenses 37 may be repeatedly arranged with the first period P1 (or the first pitch P1) in the pixel area 10, and the peripheral micro lenses 57 may be repeatedly arranged with the second period P2 (or the second pitch P2) in the peripheral area 50.

The inner pixel micro lenses 27, the outer pixel micro lenses 37 and the peripheral micro lenses 57 may have be designed to have substantially the same specification (e.g., the shape, width, thickness, curvature, diameter or volume of each micro lens).

The first pattern density of the inner pixel micro lenses 27 and the outer pixel micro lenses 37 which are arranged with the first period P1 (or the first pitch P1) may be higher than the second pattern density of the outer pixel micro lenses 37 and the peripheral micro lenses 57 which are arranged with the second period P2 (or the second pitch P2). For example, since the second period P2 is three times the first period P1, the first pattern density may be three times the second pattern density. The first period P1 (or the first pitch P1) and the second period P2 (or the second pitch P2) are the periods (or the pitches) of the micro lenses 27, 37 and 57 which are arranged in two dimensions along two directions that are perpendicular to each other.

Figure 5:
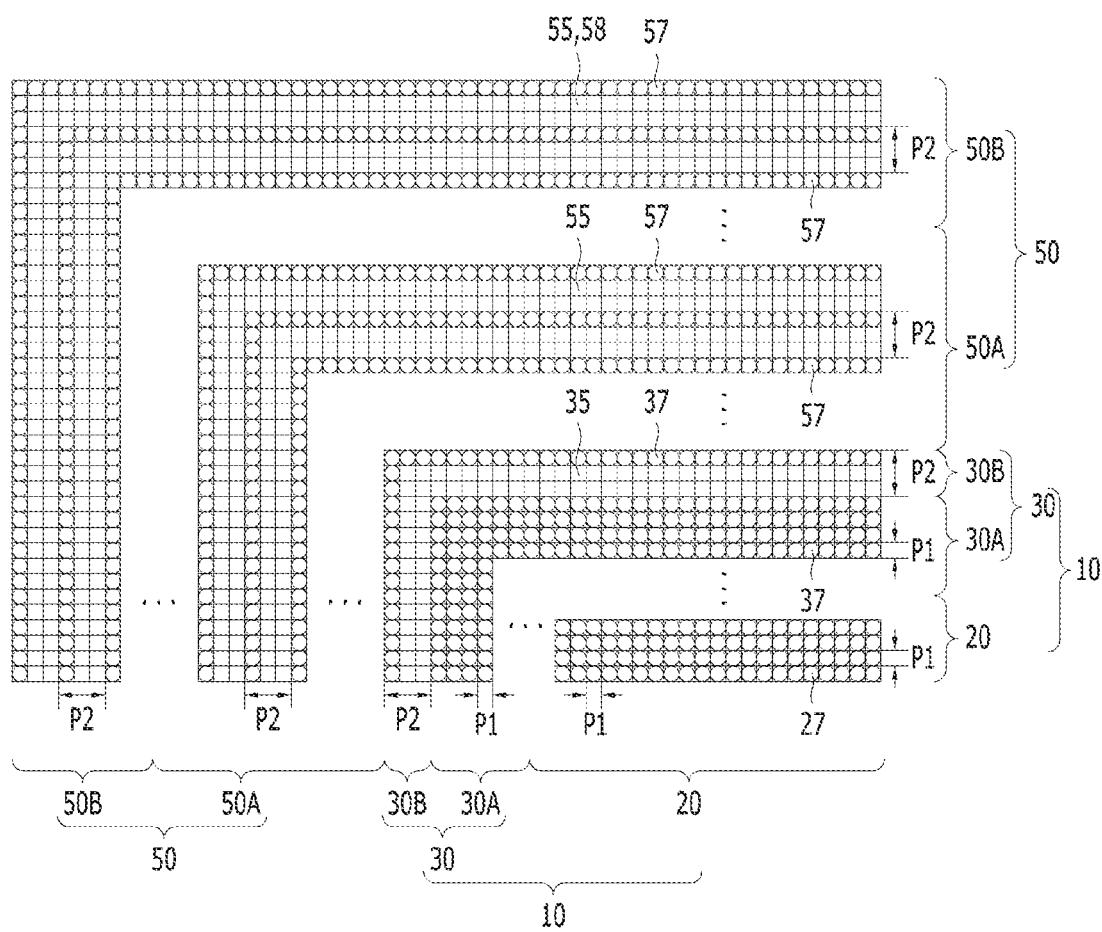
FIG. 5 is an enlarged schematic top view illustrating a representation of an example of the image sensor in accordance with the embodiment.

FIG. 5 is an enlarged schematic top view illustrating a representation of an example of the image sensor 100A in accordance with the embodiment. Referring to FIG. 5, the image sensor 100A in accordance with the embodiment may include the inner pixel area 20 including the inner pixel micro lenses 27 which are arranged in a spatial periodic pattern with the first spatial period P1, the outer pixel area 30 including the outer pixel micro lenses 37 which are arranged with the first spatial period P1 and/or the second spatial period P2, and the peripheral pixel shield area 50A and the peripheral logic shield area 50B including the peripheral micro lenses 57 which are arranged in a spatial periodic pattern with the second period P2. For instance, the second period P2 may be three times the first period P1.

In the inner pixel area 20, the inner pixel micro lenses 27 may be arranged two-dimensionally with the first period P1 (or the first pitch P1) in the horizontal direction and the vertical direction. In the outer pixel area 30, the outer pixel micro lenses 37 may be arranged differently in the first outer pixel area 30A and the second outer pixel area 30B. In the first outer pixel area 30A, the outer pixel micro lenses 37 may be arranged two-dimensionally with the first period P1 (or the first pitch P1) in the horizontal direction and the vertical direction. Thus, the outer pixel micro lenses 37 may be arranged in directions parallel to the respective sides of the inner pixel area 20. In the second outer pixel area 30B, the outer pixel micro lenses 37 may be arranged one-dimensionally with the second period P2 (or the second pitch P2) in the horizontal direction or the vertical direction. In the peripheral area 50, the peripheral micro lenses 57 may be arranged one-dimensionally with the second period P2 (or the second pitch P2) in the horizontal direction or the vertical direction. The peripheral micro lenses 57 may be arranged to have a similar shape as the outer pixel micro lenses arranged in the second outer pixel area 30B.

In some implementations, there may exist the outer pixel color filters 35 between the outer pixel micro lenses 37 in the second outer pixel area 30B and the outer pixel micro lenses 37 in the first outer pixel area 30A. In the peripheral pixel shield area 50A, since the peripheral micro lenses 57 arranged with the second period P2 in the peripheral pixel shield area 50A, there may exist a space between the peripheral micro lenses 57 separately arranged and the peripheral color filters 55 may be located in the space. In the peripheral logic shield area 503, between the peripheral micro lenses 57 arranged with the second period P2, there may exist the peripheral color filters 55 and the over color filters 58.

Figure 6:
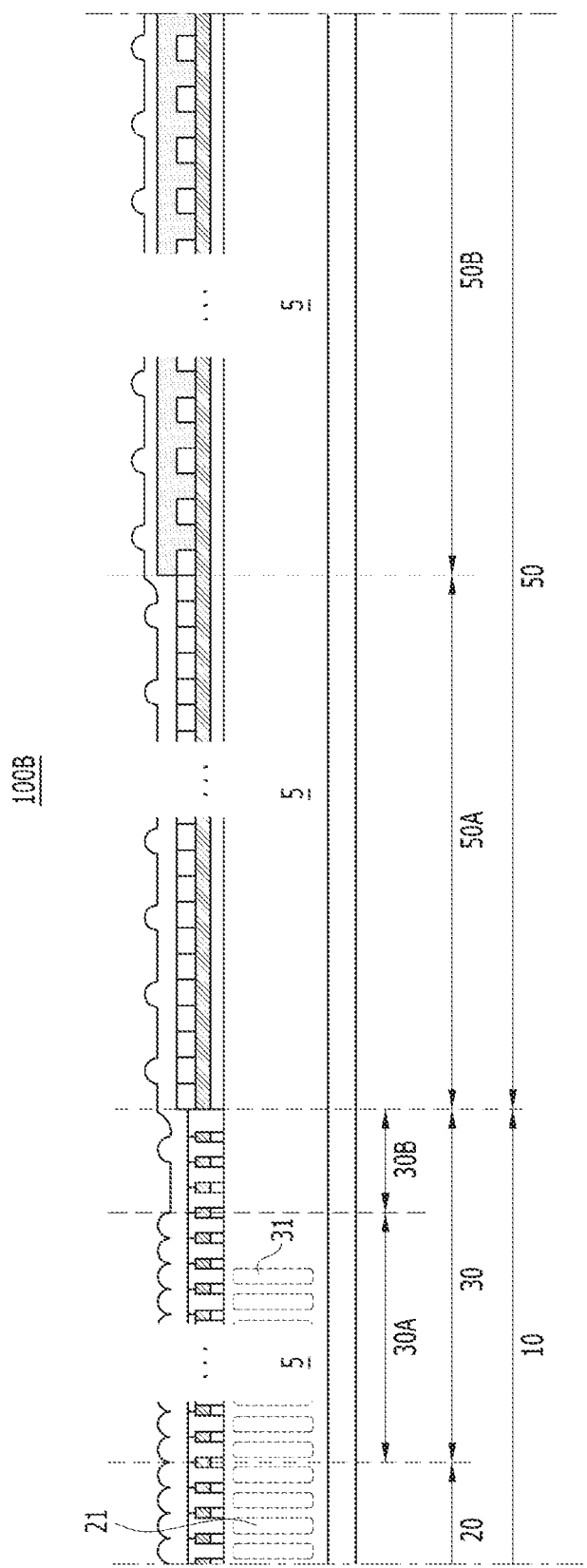
FIG. 6 is a schematic longitudinal sectional view illustrating a representation of an example of an image sensor in accordance with an embodiment.

FIG. 6 is a schematic longitudinal sectional view illustrating a representation of an example of an image sensor 100B in accordance with an embodiment. Referring to FIG. 6, the image sensor 1003 in accordance with the present embodiment may include a pixel area 10 including an inner pixel area 20 which has inner pixel photodiodes 21 and an outer pixel area 30 which has outer pixel photodiodes 31, and a peripheral area 50 including a peripheral pixel shield area 50A and a peripheral logic shield area 50B. The implementation shown in FIG. 6 has some differences from the image sensor 100A shown in FIG. 3. For example, in the peripheral area 50, the peripheral photodiodes 51, which are shown in FIG. 3, may not be formed and may be omitted. In addition, in the outer pixel area 30 of the image sensor 100B, the outer pixel photodiodes 31 may be partly formed or omitted. Unlike the image sensor shown in FIG. 4B in which the outer pixel photodiodes 31 are formed in the entire of the outer pixel area 30, in the present implementation, the outer pixel photodiodes 31 may be formed in a first outer pixel area 30A which is close to the inner pixel area 20, and the outer pixel photodiodes 31 may be omitted in a second outer pixel area 30B which is close to the peripheral area 50.

Figure 7A:
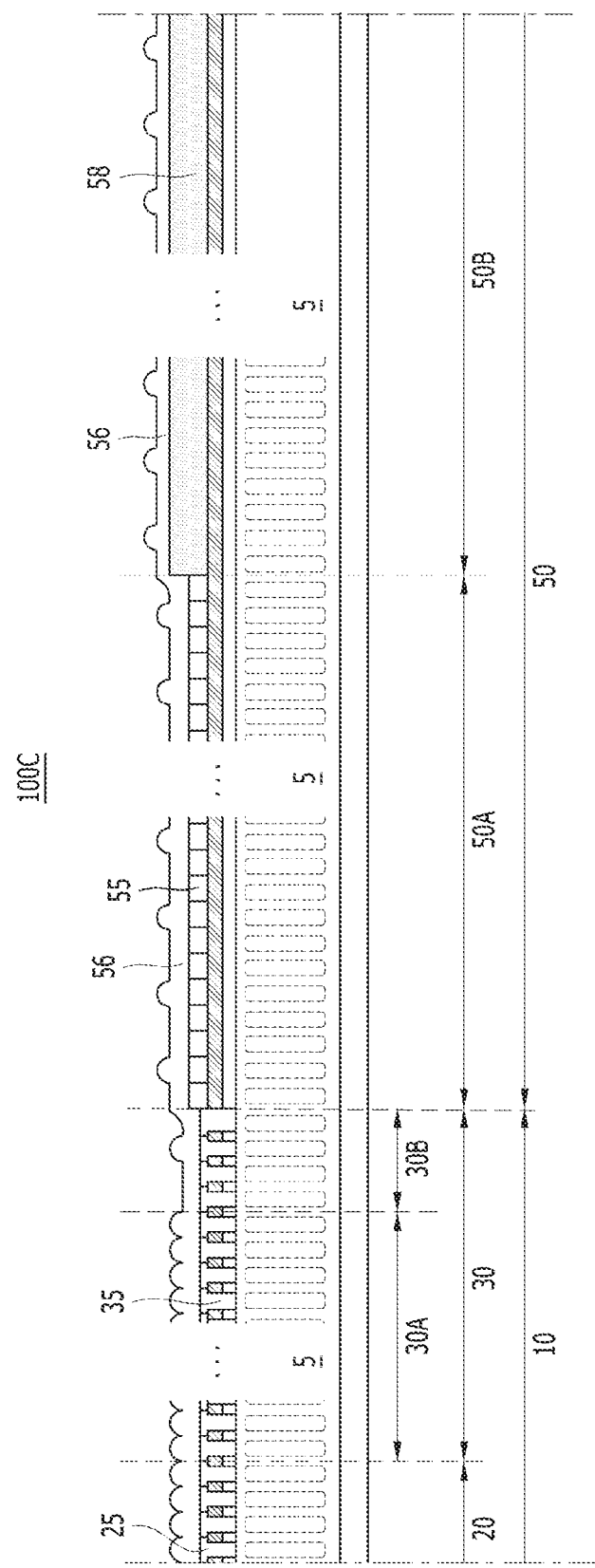

FIGS. 7A and 7B are schematic longitudinal sectional views illustrating representations of examples of image sensors 100C and 100D in accordance with embodiments. Referring to FIG. 7A, the image sensor 100C in accordance with the present embodiment may include a pixel area 10 including an inner pixel area 20 which has inner pixel color filters 25 and an outer pixel area 30 which has outer pixel color filters 35, and a peripheral area 50 including a peripheral pixel shield area 50A which has peripheral color filters 55 and a peripheral logic shield area 50B which has an over color filter 58. The implementation shown in FIG. 7A has some differences from the image sensor 100A shown in FIG. 3. For example, in the peripheral logic shield area 50B, the peripheral color filters 55 shown in FIG. 3 may not be formed and may be omitted. That is to say, only the over color filter 58 may be formed in the peripheral logic shield area 50B. Referring to FIG. 7B, the image sensor 100D in accordance with the present embodiment may include a pixel area 10 including an inner pixel area 20 which has inner pixel color filters 25 and an outer pixel area 30 which has outer pixel color filters 35, and a peripheral area 50 including a peripheral pixel shield area 50A and a peripheral logic shield area 50B which has an over color filter 58. The implementation shown in FIG. 7B has some differences from the image sensor 100A shown in FIG. 3. For example, in the peripheral pixel shield area 50A and the peripheral logic shield area 50B, the peripheral color filters 55 shown in FIG. 3 may not be formed and may be omitted. The over color filter 58 may be formed in the peripheral logic shield area 50B. In other words, a peripheral overcoating layer 56 may be formed directly on a shield layer 52 in the peripheral pixel shield area 50A, and the over color filter 58 and the peripheral overcoating layer 56 on the over color filter 58 may be formed on the shield layer 52 in the peripheral logic shield area 50B.

Figure 8:
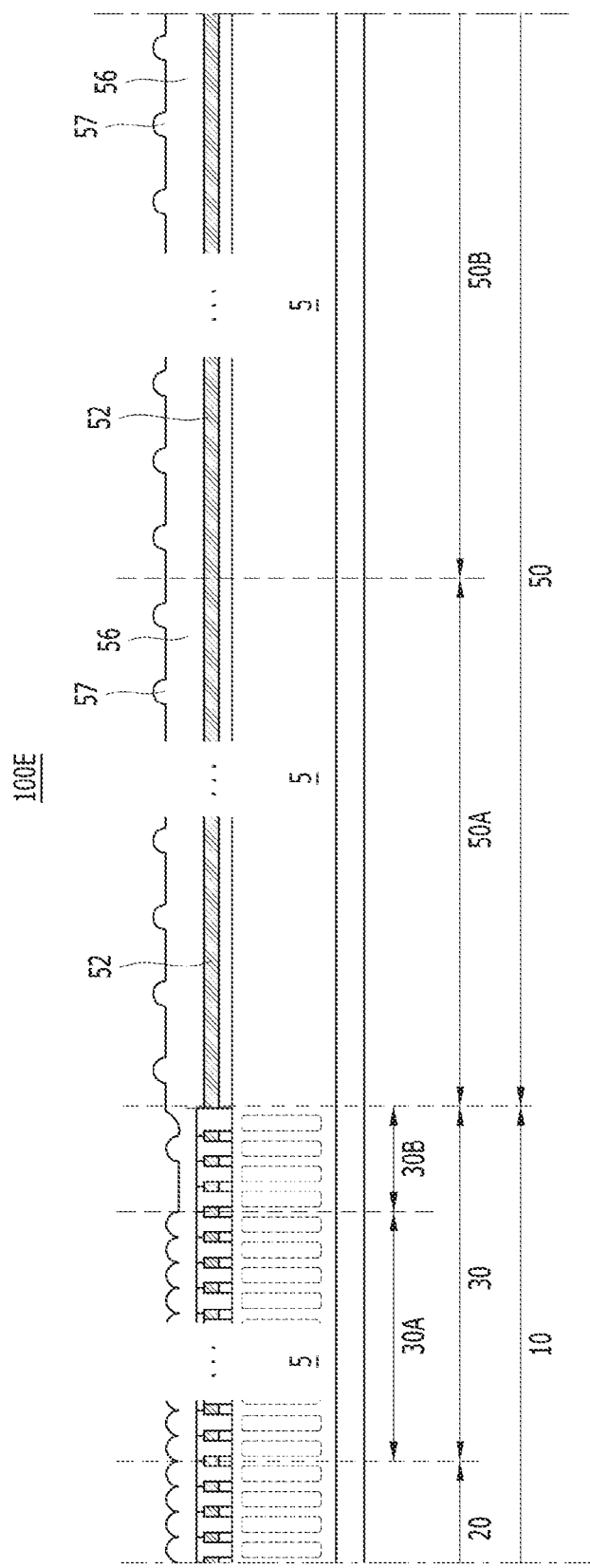
FIG. 8 is a schematic longitudinal sectional view illustrating a representation of an example of an image sensor in accordance with an embodiment.

FIG. 8 is a schematic longitudinal sectional view illustrating a representation of an example of an image sensor 100E in accordance with an embodiment. Referring to FIG. 8, the image sensor 100E in accordance with the embodiment may include a pixel area 10 including an inner pixel area 20 and an outer pixel area 30, and a peripheral area 50 including a peripheral pixel shield area 50A and a peripheral logic shield area 50B which have an overcoating layer 56 directly formed on a shield layer 52. For example, in the peripheral pixel shield area 50A and the peripheral logic shield area 50B, the peripheral color filters 55 and the over color filter 58 shown in FIG. 3 may not be formed and may be omitted.

Figure 9:
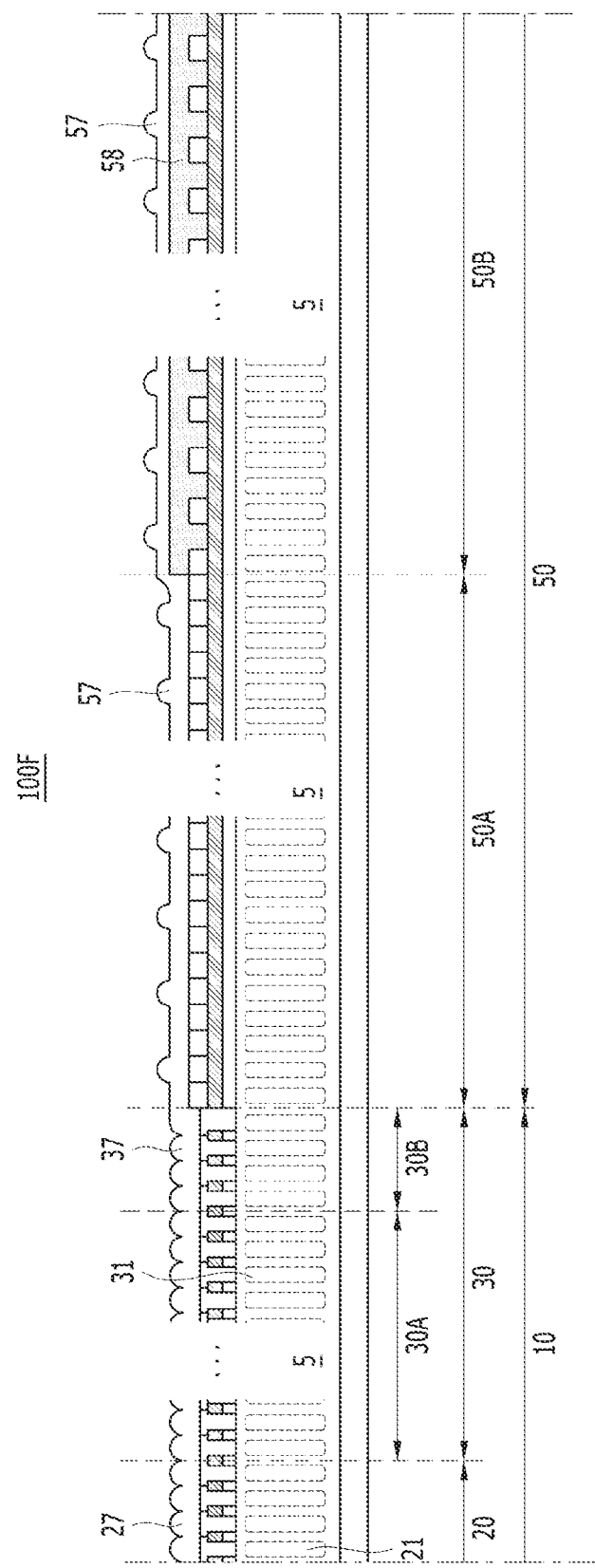
FIG. 9 is a schematic longitudinal sectional view illustrating a representation of an example of an image sensor in accordance with an embodiment.

FIG. 9 is a schematic longitudinal sectional view illustrating a representation of an example of an image sensor 100F in accordance with an embodiment. Referring to FIG. 9, the image sensor 100F in accordance with the present embodiment may include a pixel area 10 including an inner pixel area 20 which has inner pixel micro lenses 27 and an outer pixel area 30 which has outer pixel micro lenses 37, and a peripheral area 50 including a peripheral pixel shield area 50A and a peripheral logic shield area 50B which have peripheral micro lenses 57. The inner pixel area 20 and the outer pixel area 30 may include the inner pixel micro lenses 27 and the outer pixel micro lenses 37 which are repeatedly arranged in a first spatial periodic pattern with a first period P1 (or a first pitch P1), and the peripheral pixel shield area 50A and the peripheral logic shield area 50B may include the peripheral micro lenses 57 which are repeatedly arranged in a second spatial periodic pattern with a second period P2 (or a second pitch P2). When compared to the image sensor 100B of FIG. 6 where the outer pixel micro lenses 37 are arranged with the first period P1 in the first outer pixel area 30A and the outer pixel micro lenses 37 are arranged in the second outer pixel area 30B, in the outer pixel area 30 in FIG. 9, the outer pixel micro lenses 37 may be repeatedly arranged with the first period P1 (or the first pitch P1) in both of the first outer pixel area 30A and the second outer pixel area 30B.

Figure 10:
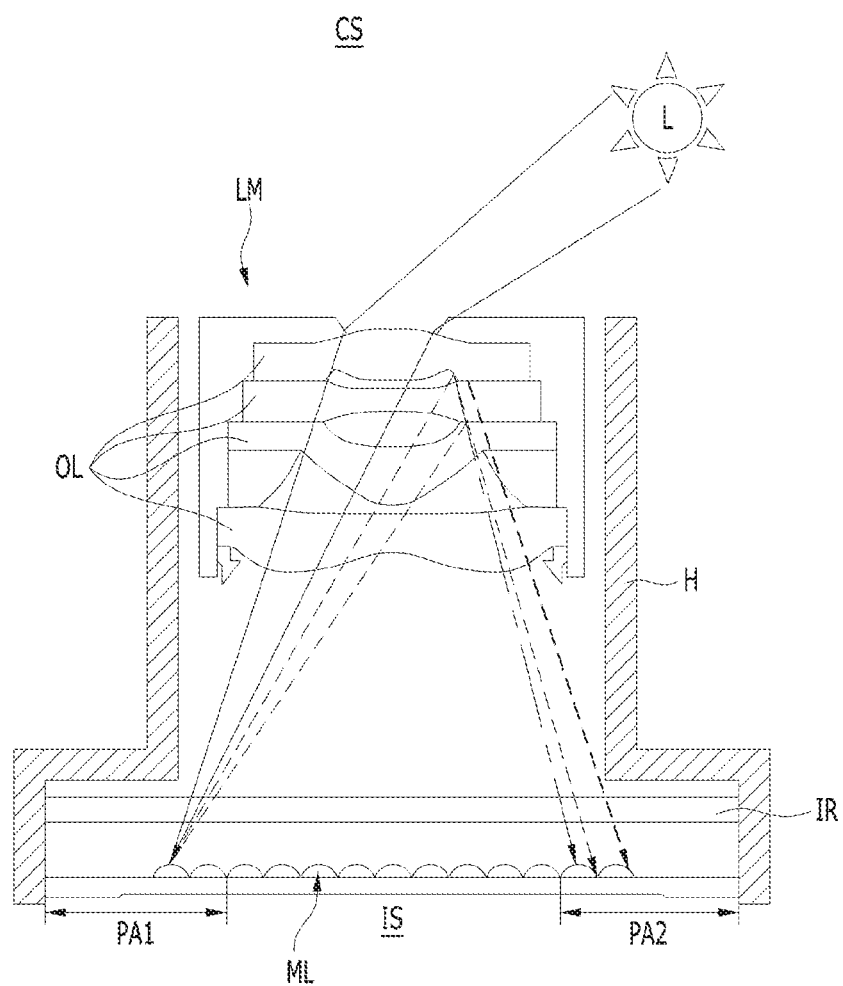
FIG. 10 is a representation of an example of a schematic diagram to assist in the explanation of reflection and diffraction paths of light in a camera system.

FIG. 10 is a representation of an example of a schematic diagram to assist in the explanation of backscattering of light in a camera system CS. Referring to FIG. 10, the camera system CS may include a housing H, and a lens module LM, an infrared filter IR and an image sensor IS which are in the housing H. The infrared filter IR may filter or block infrared light, and the lens module LM may include a plurality of optical lenses OL. For example, of the light incident on the lens module LM of the camera system CS from a light source L or a subject, particularly, the light irradiated to a first perimeter area PA1 of the image sensor IS may be backscattered from micro lenses ML and be reflected to the optical lenses of the lens module LM, and may be then reflected again and be irradiated to a second perimeter area PA2 of the image sensor IS. The first perimeter area PA1 and the second perimeter area PA2 may be positioned close to diagonally opposing corners on the image sensor IS.

Figure 11:
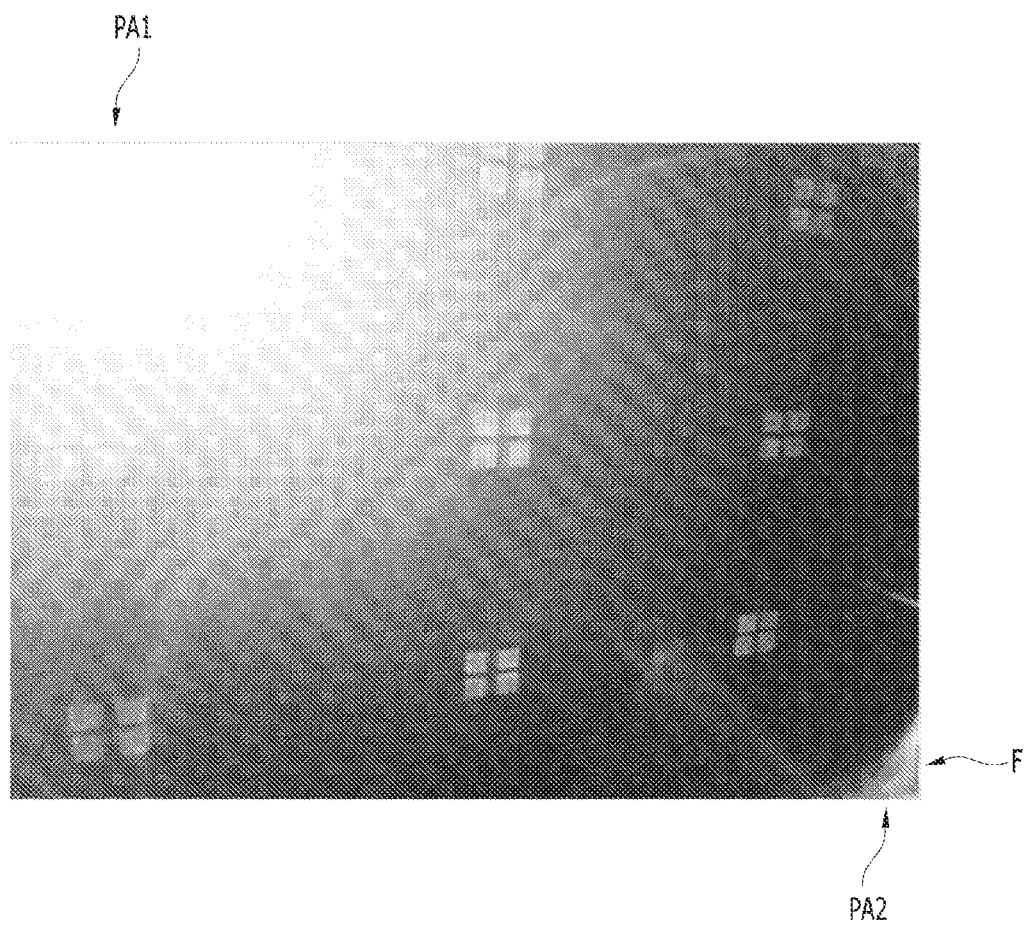
FIG. 11 is a representation of an example of the photograph of an image captured in a camera system including an image sensor according to the conventional art.

FIG. 11 is a representation of an example of the photograph of an image captured in a camera system including an image sensor according to a conventional design. Referring to FIGS. 10 and 11, the light incident on the first perimeter area PA1 may be backscattered to the optical lenses OL of the lens module LM, and may be incident again on the second perimeter area PA2. Therefore, a flare phenomenon F may occur in the second perimeter area PA2. The flare phenomenon F was measured to be the most dominant component of backscattered light of a certain angle.

Figure 12A:
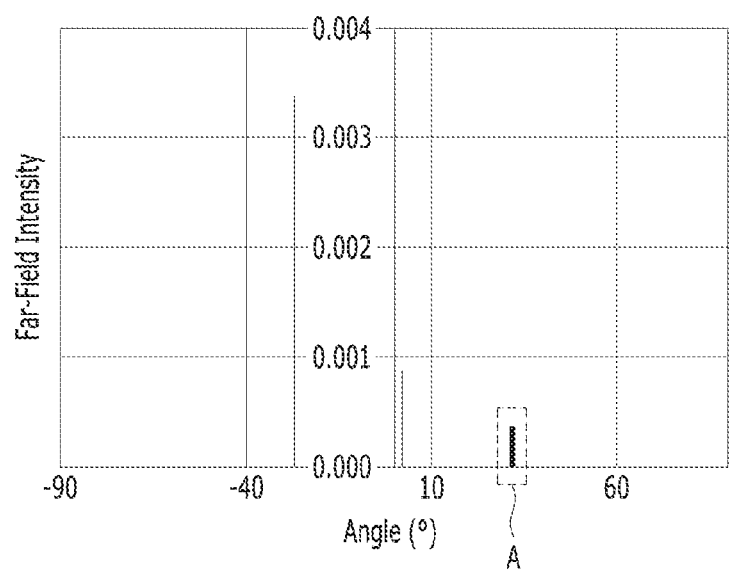
FIG. 12A is a representation of an example of a graph of light intensities according to the angles of the reflected diffraction lights measured in the camera system including the image sensor according to the conventional art.
Figure 12B:
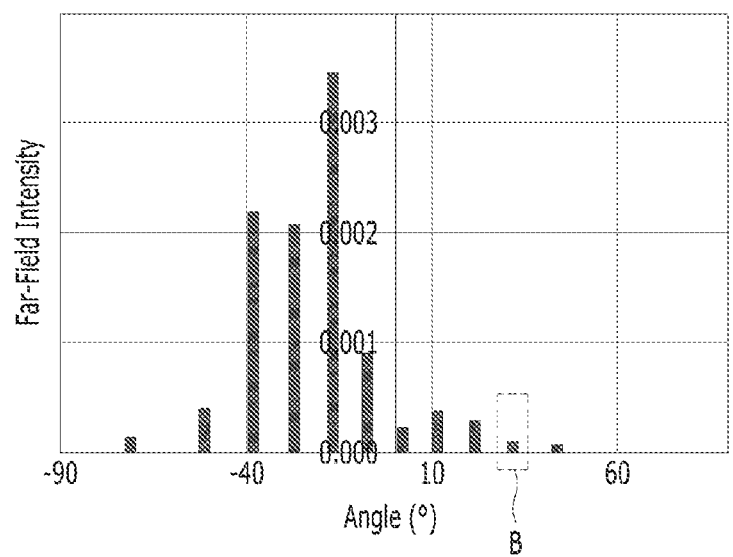
FIG. 12B is a representation of an example of a graph of light intensities according to the angles of the reflected diffraction lights measured in a camera system including one of the image sensors according to the embodiments.
Figure 12C:
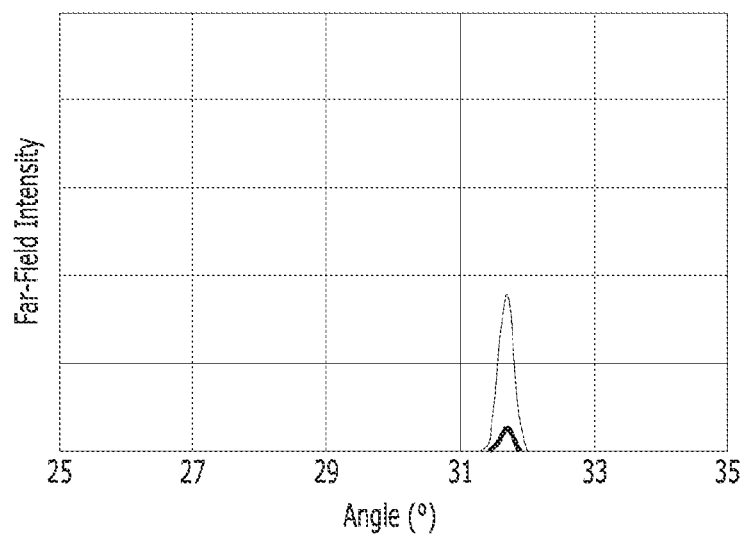
FIG. 12C is a representation of an example of a graph in which, in particular, the intensities of second-order diffraction lights in FIGS. 12A and 12B are compared by being enlarged.

FIG. 12A is a representation of an example of a graph of far-field intensities according to the angles of the backscattered lights measured in the camera system CS including the image sensor according to the conventional art, FIG. 12B is a representation of an example of a graph of far-field intensities according to the angles of the backscattered lights measured in a camera system CS including one of the image sensors 100A to 100F according to the embodiments, and FIG. 12C is a representation of an example of a graph in which the far-field intensities of backscattered lights of a certain angle shown in FIGS. 12A and 12B, which cause the flare phenomenon F of FIG. 11, are enlarged for the comparison. The X-axis represents the angle of a backscattered light, and the Y-axis represents the square value E2 of far-field intensity.

Referring to FIG. 12A, in the camera system CS including the image sensor according to the conventional art, it may be seen that dominant backscattered lights having specific angles of about (−) 27°, (+) 2°, and (+) 31.5° are generated. In FIG. 12A, the area A indicates the backscattered light which causes the flare phenomenon F of FIG. 11.

Referring to FIG. 12B, in the camera system CS including one of the image sensors 100A to 100F according to the embodiments, it may be seen that backscattered lights are generated at more various angles than the camera system CS including the image sensor according to the conventional art, That is, in comparison with FIG. 12A, the backscattered lights can be distributed at various angles and the intensities of the backscattered lights can be reduced in FIG. 12B, While being distributed at more various angles, the light intensity of at least some of the backscattered lights may reduce. For example, referring to the area B, the far-field intensity of the backscattered light which causes the flare phenomenon F of FIG. 11 significantly decreases than that of the backscattered light as shown in the area A of FIG. 12A.

Referring to FIG. 12C, it may be seen that, when compared to the far-field intensity of the backscattered light of the area A measured in the camera system CS including the image sensor according to the conventional art shown in FIG. 12A, the far-field intensity of the backscattered light of the area B measured in the camera system CS including one of the image sensors 100A to 100F according to the embodiments significantly decreases.

Therefore, in the camera system CS including one of the image sensors 100A to 100F according to the embodiments, the flare phenomenon F of FIG. 11 may not occur or may occur at a negligible degree. In FIG. 12B, backscattered lights except the backscattered light of the area B may be neglected since they do not contribute to the flare phenomenon F.

The flare phenomenon F of FIG. 11 may occur at various positions depending on the specifications, pitches, periods and so forth of the micro lenses 27, 37 and 57 of the image sensors 100A to 100F according to the embodiments. For example, in the embodiments, when the horizontal width of the micro lenses 27, 37 and 57 is about 1.12 µm, in the case where the period or pitch of the outer pixel micro lenses 37 and/or the peripheral micro lenses 57 is three times the period or pitch of the inner pixel micro lenses 27, the flare phenomenon F tends to decrease, e.g., to the minimum. Thus, in the case where the specifications, pitches, periods and so forth of the micro lenses 27, 37 and 57 are changed, the period or pitch of the outer pixel micro lenses 37 and/or the peripheral micro lenses 57 may be set to have various integer times.

Figure 13:
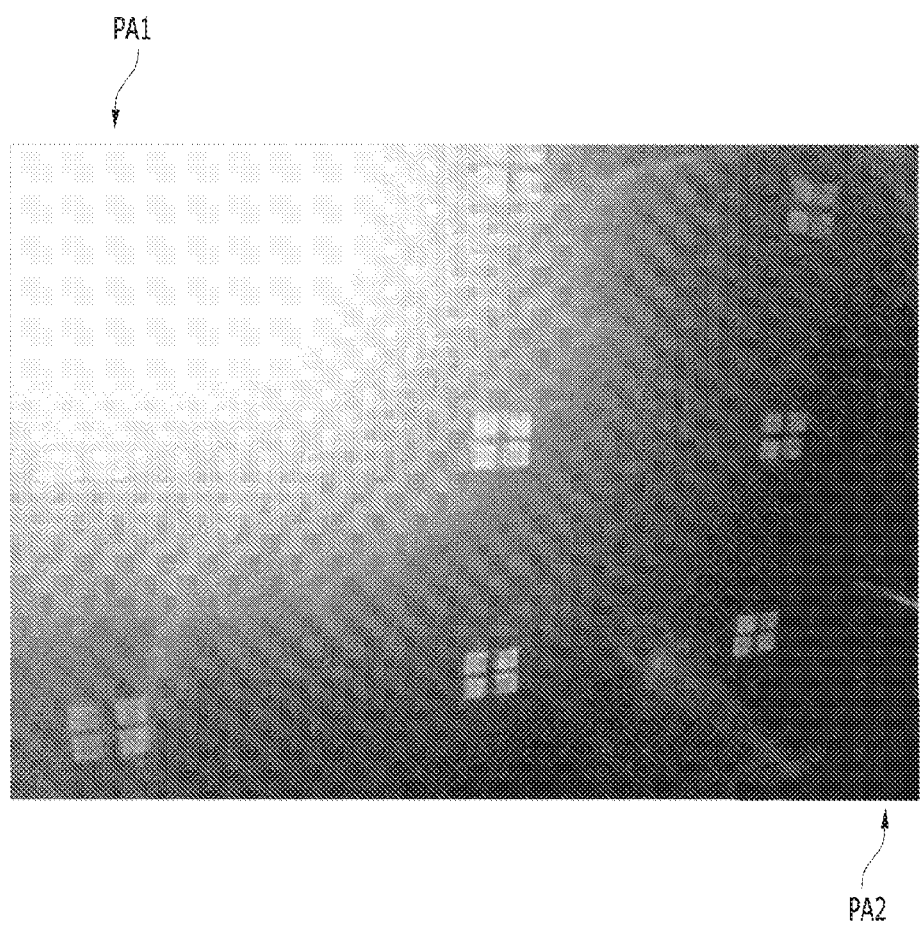
FIG. 13 is a representation of an example of the photograph of an image captured in the camera system including one of the image sensors according to the embodiments.

FIG. 13 is a representation of an example of the photograph of an image captured in the camera system CS including one of the image sensors 100A to 100F according to the embodiments. Referring to FIG. 13, it may be seen that the flare phenomenon F in the second perimeter area PA2 shown in FIG. 11 disappeared.

Figure 14:
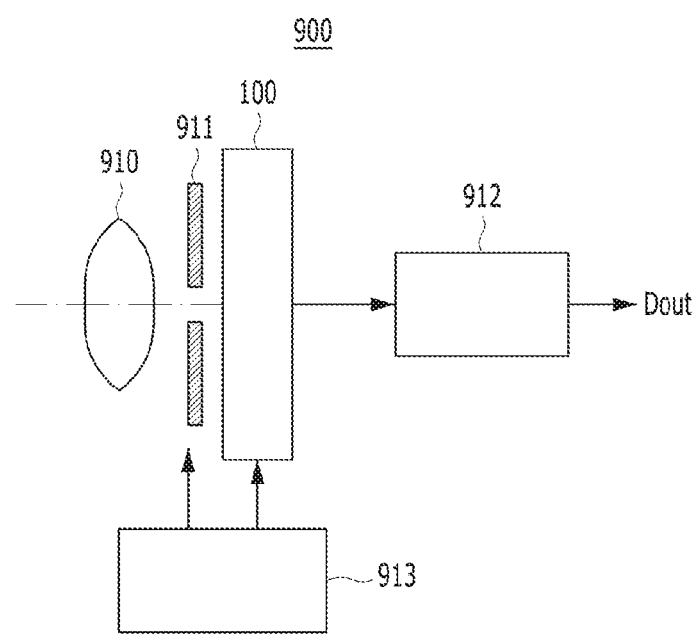
FIG. 14 is a diagram schematically illustrating a representation of an example of a camera system including one of the image sensors according to the embodiments.

FIG. 14 is a diagram schematically illustrating a representation of an example of a camera system 900 including one of the image sensors 100A to 100F according to the embodiments. Referring to FIG. 14, the camera system 900 including at least one of the image sensors 100A to 100F according to the embodiments may photograph a still image or a moving image. The camera system 900 may include an optical lens system 910, a shutter unit 911, a driving circuit 913 which controls/drives an image sensor 100 and the shutter unit 911, and a signal processing circuit 912. The image sensor 100 may include one of the image sensors 100A to 100F according to the various embodiments. The camera system 900 may guide image light (Li) (incident light) from an object, to a pixel array (see the reference numeral 110 of FIG. 1) of the image sensor 100. The optical lens system 910 may include a plurality of optical lenses. The shutter unit 911 may control a light irradiation period and a light shielding period for the image sensor 100. The driving circuit 913 may control the transmission operation of the image sensor 100 and the shutter operation of the shutter unit 911. The signal processing circuit 912 may perform various kinds of signal processing for the signal outputted from the image sensor 100. An image signal Dout after signal processing may be stored in a storage medium such as a memory or may be outputted to a monitor or the like.

Although various embodiments have been described for illustrative purposes, it will be apparent to those skilled in the art that various changes and modifications can be further made based on the disclosed technology.

What is claimed is:

1. An image sensor comprising:
    a pixel area structured to include photosensing pixels that detect light of a scene to produce pixel signals representing the detected scene including spatial information of the detected scene; and
    a peripheral area structured to surround the pixel area and to shield light,
    wherein the pixel area includes first micro lenses positioned over the photosensing pixels in a periodic array with a first spatial period, and the peripheral area includes second micro lenses in a periodic array with a second, different spatial period.

2. The image sensor according to claim 1, wherein each of the first micro lenses and each of the second micro lenses have a same micro lens design including a lens shape, a lens width, or a lens thickness.

3. The image sensor according to claim 1,
    wherein the first period is the same as a horizontal width or diameter of the first micro lenses, and
    wherein the second period is greater than a horizontal width or diameter of the second micro lenses.

4. The image sensor according to claim 3, wherein the second period is integer times the first period.

5. The image sensor according to claim 1,
    wherein the first micro lenses are arranged in the pixel area in a horizontal direction and a vertical direction, and
    wherein the second micro lenses are arranged in the peripheral area in the horizontal direction or the vertical direction.

6. The image sensor according to claim 1,
    wherein the first micro lenses have a first pitch in the pixel area, and
    wherein the second micro lenses have a second pitch in the peripheral area.

7. The image sensor according to claim 1,
    wherein the first micro lenses have a first pattern density in the pixel area,
    wherein the second micro lenses have a second pattern density in the peripheral area, and
    wherein the first pattern density is higher than the second pattern density.

8. The image sensor according to claim 1,
    wherein the pixel area comprises:
    an inner pixel area; and
    an outer pixel area surrounding the inner pixel area,
    wherein the inner pixel area comprises:
    inner pixel photodiodes formed in a substrate;
    inner pixel grid patterns disposed over a top surface of the substrate;
    inner pixel color filters disposed in spaces between the inner pixel grid patterns;
    an inner pixel overcoating layer disposed over the inner pixel color filters; and
    inner pixel micro lenses disposed over the inner pixel overcoating layer,
    wherein the outer pixel area comprises:
    outer pixel photodiodes formed in the substrate;
    outer pixel grid patterns disposed over the top surface of the substrate;
    outer pixel color filters disposed in spaces between the outer pixel grid patterns;
    an outer pixel overcoating layer disposed over the outer pixel color filters; and
    outer pixel micro lenses disposed over the outer pixel overcoating layer, and
    wherein the first micro lenses include the inner pixel micro lenses and the outer pixel micro lenses.

9. The image sensor according to claim 1,
    wherein the peripheral area includes an inner peripheral area and an outer peripheral area surrounding the inner peripheral area, wherein each of the inner peripheral area and the outer peripheral area comprises:
a shield layer disposed over the top surface of a substrate;
a peripheral overcoating layer disposed over the shield layer; and
peripheral micro lenses disposed over the peripheral overcoating layer, and
wherein the second micro lenses include the peripheral micro lenses.

10. The image sensor according to claim 9,
wherein the inner peripheral area further comprises peripheral color filters which are formed over the shield layer,
wherein the outer peripheral area further comprises an over color filter which is formed over the shield layer, and
wherein the over color filter has a vertical thickness thicker than the peripheral color filters.

11. The image sensor according to claim 10, wherein the over color filter includes a blue color filter.

12. The image sensor according to claim 10,
where the peripheral color filters are formed in the outer peripheral area, and
wherein the over color filter is formed between the peripheral color filters.

13. The image sensor according to claim 9,
wherein the shield layer has a flat board shape or a plate shape, and includes a bottom shield layer and a top shield layer, and
wherein the bottom shield layer includes a dielectric material, and the top shield layer includes a metal.

14. An image sensor comprising:
a first pixel area structured to include first pixels each operable to sense light and to produce a pixel signal representing sensed light; and
a peripheral area surrounding the first pixel area,
the first pixel area comprising:
first pixel grid patterns that are disposed over a substrate and are formed by the first pixels;
first pixel color filters formed in spaces between the first pixel grid patterns;
a first pixel overcoating layer over the first pixel color filters; and
first pixel micro lenses disposed over the first pixel overcoating layer,
the peripheral area comprising:
a shield layer disposed over the substrate;
a peripheral overcoating layer disposed over the shield layer; and
peripheral micro lenses disposed over the peripheral overcoating layer,
wherein the first pixel micro lenses are arranged in a first periodic pattern with a first spatial period, and
wherein the peripheral micro lenses are arranged in a second periodic pattern with a second spatial period different from the first spatial period.

15. The image sensor according to claim 14, further comprising:
a second pixel area surrounding the first pixel area between the first pixel area and the peripheral area,
wherein the second pixel area comprises:
second pixel grid patterns disposed over the substrate;
second pixel color filters formed in spaces between the second pixel grid patterns;
a second pixel overcoating layer formed over the second pixel color filters; and
second pixel micro lenses over the second pixel overcoating layer.

16. The image sensor according to claim 15,
wherein the second pixel area includes an inner second pixel area which is close to the first pixel area and an outer second pixel area which is close to the peripheral area, and
wherein the second pixel micro lenses are arranged with the first period in the inner second pixel area and are arranged with the second period in the outer second pixel area.

17. The image sensor according to claim 14,
wherein the peripheral area includes an inner peripheral area which is close to the first pixel area and an outer peripheral area which surrounds the inner peripheral area, and
wherein the outer peripheral area further comprises an over color filter which is disposed between the shield layer and the peripheral overcoating layer.

18. The image sensor according to claim 17, wherein the inner peripheral area further comprises peripheral photodiodes which are formed in the substrate and peripheral color filters which are formed over the shield layer.

19. The image sensor according to claim 14,
wherein the first pixel micro lenses and the peripheral micro lenses have a same specification including at least one of a shape, a width, or a thickness, and
wherein a pattern density of the first pixel micro lenses in the first pixel area is higher than a pattern density of the peripheral micro lenses in the peripheral area.

20. The image sensor according to claim 14, wherein the second period is integer times the first period.

21. An image sensor comprising:
an inner pixel area which detects light of a scene to produce pixel signals representing the detected scene including spatial information of the detected scene and including first micro lenses arranged with a first period;
an outer pixel area located to surround the inner pixel area and including second micro lenses arranged with a second period;
a peripheral area located to surround the outer pixel area and including third micro lenses arranged with a third period;
wherein two of the first period, the second period, and the third period are different from each other.

22. The image sensor of claim 21, wherein the first period is different from the third period.

23. The image sensor of claim 21, wherein the first period is different from the second period.

24. The image sensor of claim 21, wherein the outer pixel area includes a first outer pixel area and a second outer pixel area surrounding the first outer pixel area and the second micro lenses are arranged in the first outer pixel area or the second outer pixel area, or both of the first outer pixel area and the second outer pixel area.

* * * * *